(12) United States Patent
Majcherczak

(10) Patent No.: US 7,888,967 B2
(45) Date of Patent: Feb. 15, 2011

(54) LEVEL TRANSLATOR CIRCUIT

(75) Inventor: Sylvain Majcherczak, Saint Pierre D'Allevard (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 12/543,395

(22) Filed: Aug. 18, 2009

(65) Prior Publication Data
US 2010/0045342 A1 Feb. 25, 2010

(30) Foreign Application Priority Data
Aug. 19, 2008 (FR) .................................. 08/55615

(51) Int. Cl.
*H03K 19/094* (2006.01)
(52) U.S. Cl. .......................................... 326/68; 326/86
(58) Field of Classification Search .................. 326/68, 326/80–83, 86–87; 327/108–109, 333
See application file for complete search history.

(56) References Cited

U.S. PATENT DOCUMENTS

| 6,043,699 | A | * | 3/2000 | Shimizu ..................... 327/333 |
| 6,249,145 | B1 | * | 6/2001 | Tanaka et al. ................. 326/68 |
| 6,373,315 | B2 | * | 4/2002 | Tsuji et al. ................... 327/333 |
| 2007/0057702 | A1 | | 3/2007 | Suenaga |
| 2008/0061847 | A1 | | 3/2008 | Nakagawa |

FOREIGN PATENT DOCUMENTS

JP 2004-15621 A 1/2004

* cited by examiner

*Primary Examiner*—James Cho
(74) *Attorney, Agent, or Firm*—Lisa K. Jorgenson; Robert Iannucci; Seed IP Law Group PLLC

(57) ABSTRACT

A voltage-level translator circuit including two pairs of branches in parallel, each pair including a low-impedance branch, where the low-impedance branches can be activated or deactivated. A possible application is the voltage level switching of data originating from an integrated circuit.

21 Claims, 7 Drawing Sheets

LEVEL TRANSLATOR CIRCUIT

BACKGROUND

1. Technical Field

The present disclosure relates to a circuit for translating a voltage level. Such a circuit may be used in input/output interfaces of an integrated circuit. Indeed, in integrated circuits, the data may have very low voltage levels, which may need to be increased for the processing by the circuits external to the integrated circuits, which operate under high voltages.

2. Description of the Related Art

FIG. 1 shows a conventional voltage-level translator circuit 1.

Circuit 1 comprises an input data-IN receiving input data from an integrated circuit. The data are digital data, with their two states respectively corresponding to a zero voltage (ground GND) and to a positive voltage VDD. Input data-IN is connected to the gate of an NMOS transistor $M_0$. The source of transistor $M_0$ is connected to a node M connected to ground GND. The drain of transistor $M_0$ is connected to a node A.

Circuit 1 also comprises a PMOS transistor $M'_0$ having its drain connected to node A. The source of transistor $M'_0$ is connected to a node N connected to a supply terminal having a voltage V+ higher than voltage VDD. The gate of transistor $M'_0$ is connected to a node B.

Circuit 1 also comprises an input $\overline{data}$-IN which receives inversion data $\overline{data}$ that are inversions of the input data. Input $\overline{data}$-IN drives the gate of an NMOS transistor $M_1$. The source of transistor $M_1$ is connected to node M. The drain of transistor $M_1$ is connected to node B.

Circuit 1 also comprises a PMOS transistor $M'_1$ having its drain connected to node B. The source of transistor $M'_1$ is connected to node N. The gate of transistor $M'_1$ is connected to node A.

Node B is connected to an output DATA-OUT which issues output data corresponding to the input data. Output data have a high level, also called high state or state or level 1, corresponding to voltage V+ and a low level, also called low state or state or level 0, corresponding to zero. Node A is connected to an output $\overline{DATA}$-OUT which provides the inverse of output data.

The operation of the circuit of FIG. 1 will be discussed in relation with FIGS. 2a to 2f which schematically illustrate various timing diagrams of variables involved in circuit 1.

At time t=0, the input data (FIG. 2a) are at a low state and the voltage at input data-IN is equal to zero. Transistor $M_0$ is off and, neglecting a leakage current, the drain-source current $IDS(M_0)$ running through transistor $M_0$ (FIG. 2d) is zero. At time t=0, data $\overline{data}$ (FIG. 2b) are at a high state and the voltage at input $\overline{data}$-IN is equal to voltage $V_{DD}$. Transistor $M_1$ is then on and voltage $V_B$ at node B is (substantially) zero (FIG. 2e). The voltage at node B being zero, transistor $M'_0$ is on and voltage $V_A$ at node A (FIG. 2c) is equal to V+. The gate of transistor $M'_1$ being at voltage V+, transistor $M'_1$ is off and the drain-source current $IDS(M_1)$ running through transistor $M_1$ (FIG. 2f) is zero (neglecting its leakage current).

At time t=t1, the input data switch from the low state to the high state and data $\overline{data}$ switch from the high state to the low state. Transistor $M_0$ turns on and the voltage at node A will decrease. This decrease is not instantaneous and the voltage at node A reaches 0 at time t'1. Difference t'1-t1 corresponds to the switching time and, between times t1 and t'1, current $IDS(M_0)$ increases, crosses a threshold, then decreases back to recover value 0 at time t'1. As concerns node B, transistor $M_1$ turns off at time t1 and the voltage at node B rises from the time when transistor $M'_1$ starts conducting. At the end of the transition, at time t'1, node A is 0, node B is at V+, transistors $M_0$ and $M'_1$ are on, and transistors $M_1$ and $M'_0$ are off.

At time t2, the input data switch from state 1 to state 0 and data $\overline{data}$ switch from state 0 to state 1. Transistor $M_0$ turns off and transistor $M_1$ turns on. The voltage at node A increases to reach value V+ at time t'2 and the voltage at node B decreases to reach value 0 at time t'2. During the transition, the current in transistors $M_1$ and $M'_1$ first increases, then decreases, while the voltage at node B decreases and the voltage at node A increases. After time t'2, transistors $M_1$ and $M'_0$ are on, and transistors $M_0$ and $M'_1$ are off.

The circuit of FIG. 1 has disadvantages. The current tendency in the art is to have increasingly small voltages VDD, which results in increasing switching times. Thus, when voltage VDD comes close to the threshold of transistors $M_0$ and $M_1$, said transistors operate with a low gate/source voltage, which limits their saturation current and the state of nodes A and B cannot change fast.

A solution to decrease switching times would be to increase the saturation current of transistors $M_0$ and $M_1$ by increasing the size of transistors $M_0$ and $M_1$. However, in this case, the required silicon surface area risks being incompatible with the desired application. Further, this solution would increase the stray capacitance and the leakage current of transistors $M_0$ and $M_1$.

BRIEF SUMMARY

One embodiment provides a level translator circuit using a small silicon surface area, a circuit enabling short switching times, a circuit with a small stray capacitance, a circuit requiring no external biasing, a circuit with transistors likely to have small leakage currents, a circuit enabling to work at low voltage VDD, a circuit enabling to work with strong differences between VDD and V+, etc.

Thus, one embodiment provides a voltage-level translator circuit comprising:

at least one first MOS transistor, of a first type, having a gate capable of receiving input data likely to vary between a first voltage level and a second voltage level, smaller than the first voltage level, having its source coupled to a first node and having its drain coupled to a second node;

at least one second MOS transistor, of the first type, having a gate capable of receiving the inverse of the input data, having its source coupled to the first node, and having its drain coupled to a third node;

at least one third MOS transistor, of the second type, having its gate coupled to the third node, having its source coupled to a fourth node, and having its drain coupled to the second node;

at least one fourth MOS transistor, of the second type, having its gate coupled to the second node, having its source coupled to the fourth node, and having its drain coupled to the third node, the third node being capable of issuing output data corresponding to the input data and the second node being capable of issuing the inverse of the output data, the output data being likely to vary between a third voltage level and the second voltage level, the third voltage level being greater than the first voltage level;

wherein the circuit comprises:

at least one first and one second branches between the second node and the fourth node, the second branch exhibiting a smaller impedance than the first branch;

at least one third and one fourth branches between the third node and the fourth node, the fourth branch exhibiting a smaller impedance than the third branch; and a selection unit capable of activating the second branch and of deactivating the fourth branch before the second node switches from the second voltage level to the third voltage level and capable of deactivating the second branch and of activating the fourth branch before the second node switches from the third voltage level to the second voltage level.

In one embodiment the first MOS transistor type corresponds to NMOS transistors and the second transistor type corresponds to PMOS transistors, and the first node is coupled to ground and the fourth node is coupled to a positive supply voltage.

In one embodiment the selection unit is coupled to the second node and/or to the third node.

In one embodiment the second or the fourth branch comprises a PMOS transistor with a high saturation current.

In one embodiment the first or the third branch comprises a PMOS transistor with a low saturation current.

In one embodiment the first or the third branch comprises a resistor.

In one embodiment the circuit comprises:

a first and a second paths connected in parallel between the second and the fourth node, the first path comprising a first PMOS transistor series-connected with a high-impedance element and the second path comprising a second PMOS transistor series-connected with a low-impedance element;

a third and a fourth paths connected in parallel between the third and the fourth node, the third path comprising a third PMOS transistor series-connected with a high-impedance element and the fourth path comprising a fourth PMOS transistor series-connected with a low-impedance element.

In one embodiment the selection circuit comprises one or several logic gates and inverters.

Specific embodiments will be discussed in detail in the following non-limiting description in connection with the accompanying drawings.

DETAILED DESCRIPTION

Figure 3:
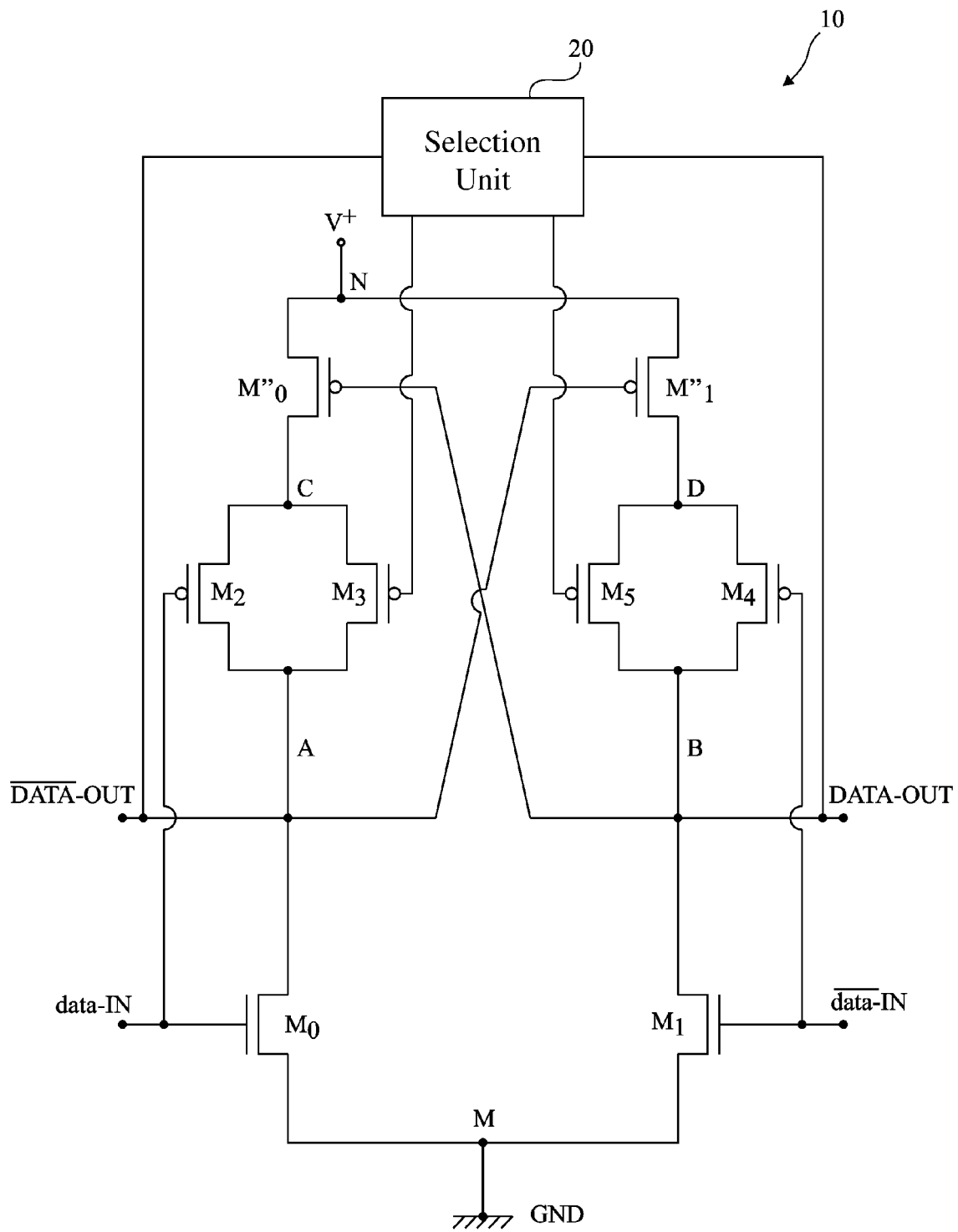
FIG. 3 shows one embodiment of a translator circuit.

FIG. 3 shows a circuit 10 illustrating one embodiment.

Figure 1:
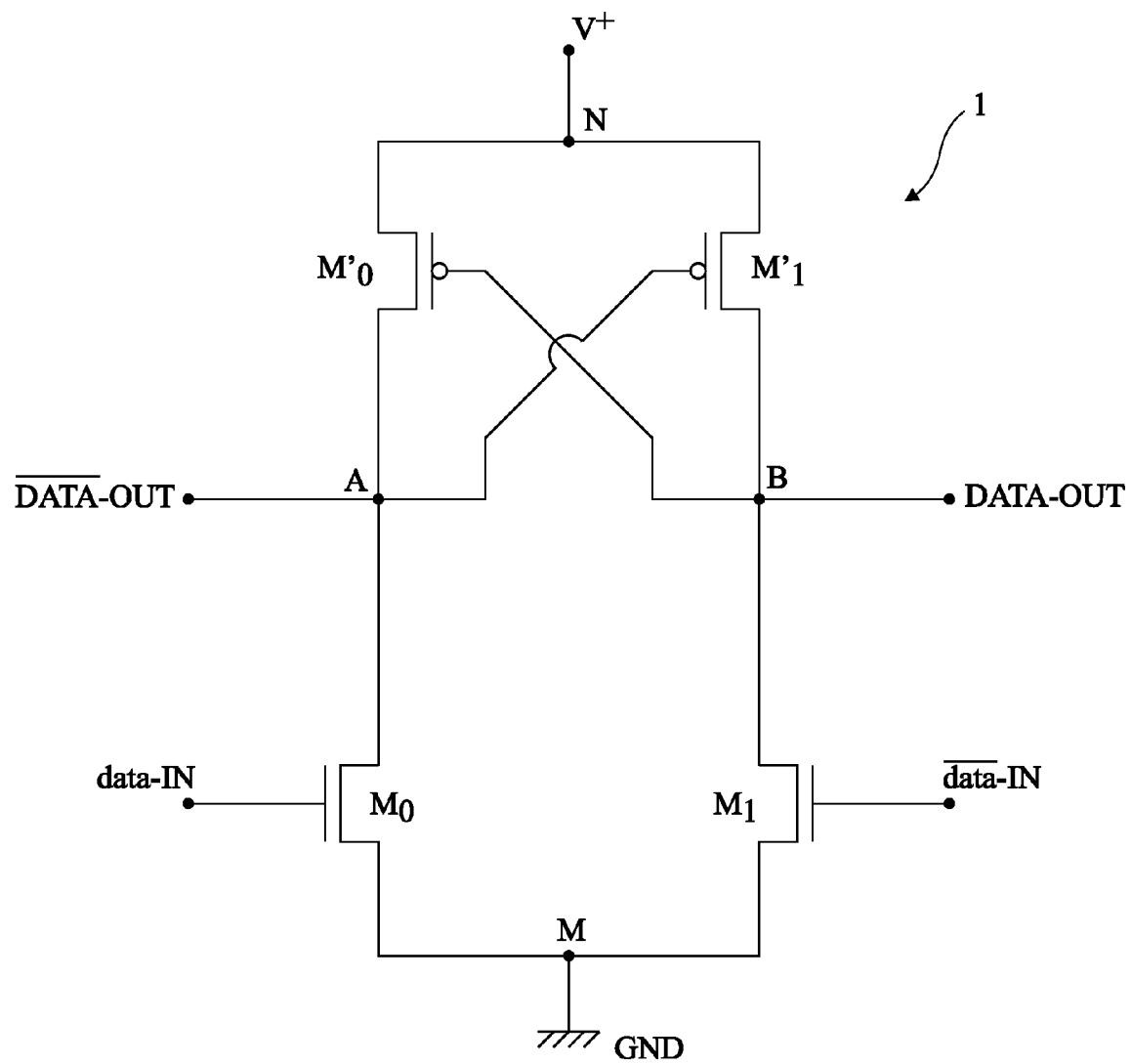
FIG. 1, previously described, shows a conventional structure of a voltage level translator circuit.
Figure 2A:
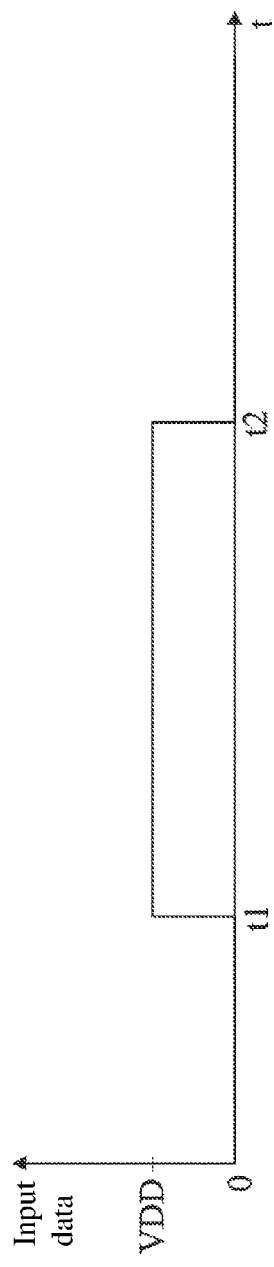
FIGS. 2a-2f, previously described, show timing diagrams for explaining the operation of FIG. 1.
Figure 2B:
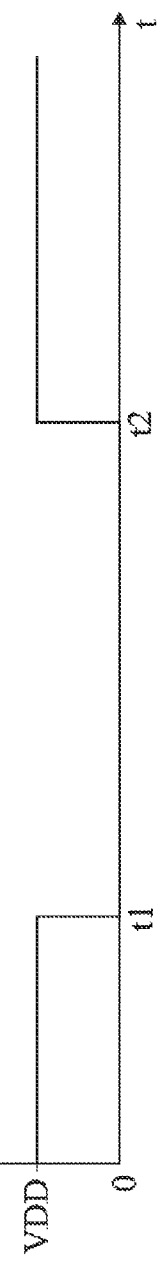
Figure 2C:
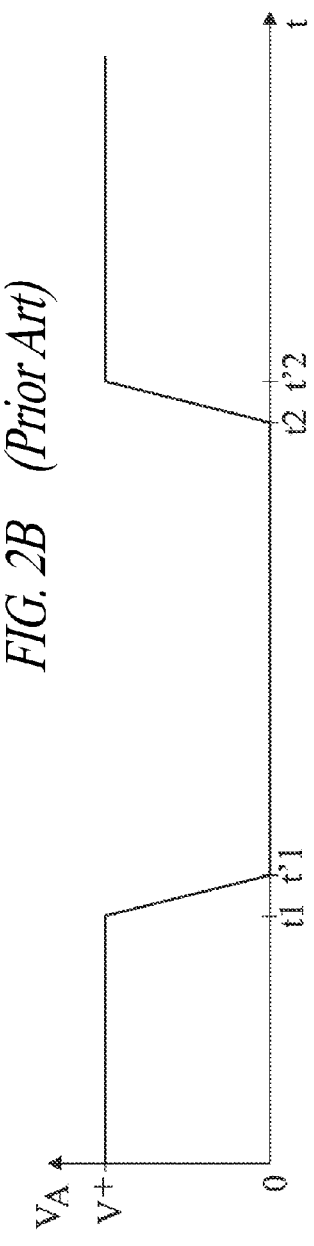
Figure 2D:
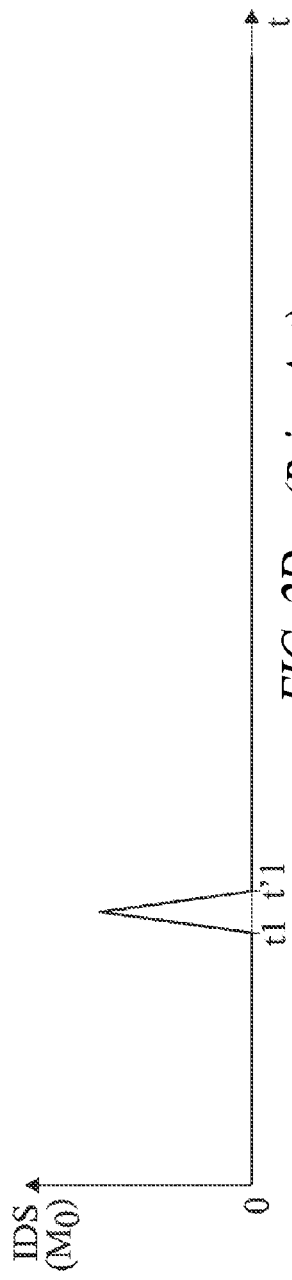
Figure 2E:
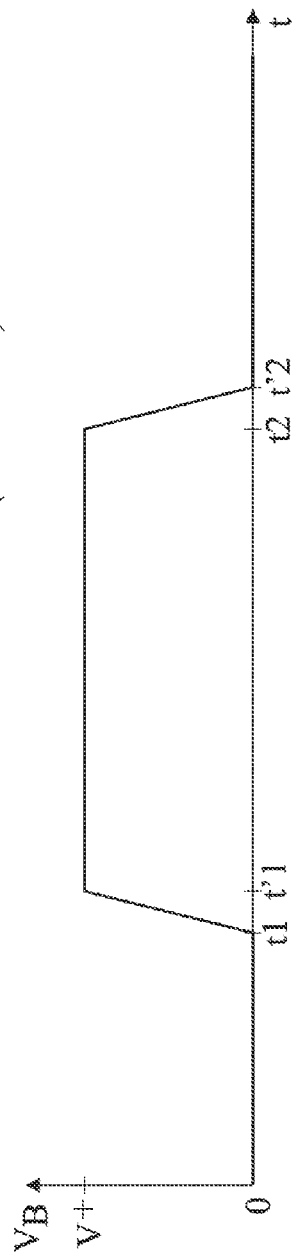
Figure 2F:
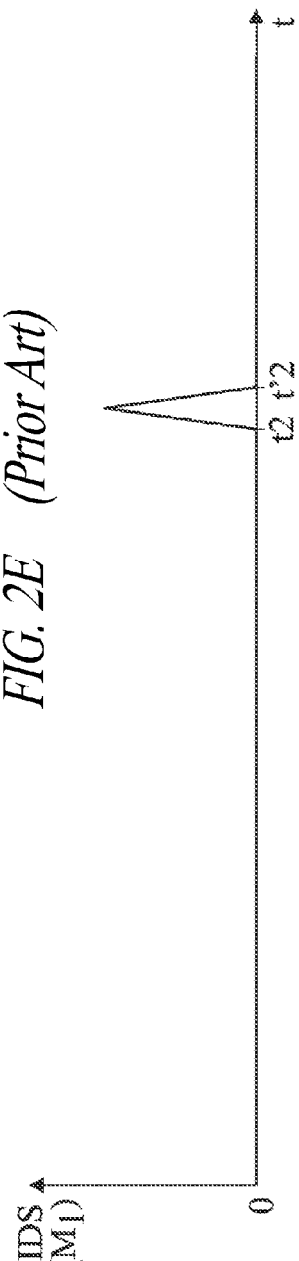

In FIG. 3, circuit 10 comprises an NMOS transistor $M_0$ and an NMOS transistor $M_1$ of same structure and of same operation as in the circuit of FIG. 1. Circuit 10 also comprises, as in FIG. 1, nodes A, B, M, and N. Generally, any reference letter or numeral common to FIGS. 1 and 3 corresponds to element of same type and of same function, which will not be specifically described again.

In FIG. 3, circuit 10 further comprises a PMOS transistor $M''_0$ having its source connected to node N and having its drain connected to a node C. The gate of transistor $M''_0$ is connected to node B. Circuit 10 also comprises a PMOS transistor $M_2$ having its source connected to node C and its drain connected to node A. The gate of transistor $M_2$ is connected to data input data-IN. Circuit 10 also comprises a PMOS transistor $M_3$ having its source connected to node C and its drain connected to node A. The gate of transistor $M_3$ is connected to a selection unit 20. As will be seen hereafter, transistor $M_2$ corresponds to a high-impedance branch and transistor $M_3$ corresponds to a low-impedance branch, transistor $M_2$ having a low saturation current and transistor $M_3$ having a high saturation current.

In FIG. 3, circuit 10 also comprises a PMOS transistor $M''_1$ having its source connected to node N and having its drain connected to a node D. The gate of transistor $M''_1$ is connected to node A. Circuit 10 also comprises a PMOS transistor $M_4$ having its source connected to node D and having its drain connected to node B. The gate of transistor $M_4$ is connected to inverse data input $\overline{\text{data}}$-IN. Circuit 10 also comprises a PMOS transistor $M_5$ having its source connected to node D and having its drain connected to node B. The gate of transistor $M_5$ is connected to selection unit 20. As will be seen hereafter, transistor $M_4$ corresponds to a high-impedance branch and transistor $M_5$ corresponds to a low-impedance branch, transistor $M_4$ having a low saturation current and transistor $M_5$ having a high saturation current.

In the embodiment of FIG. 3, selection unit 20 is coupled, on the one hand, to data output DATA-OUT and, on the other hand, to inverse data output $\overline{\text{DATA}}$-OUT. As will be seen hereafter, selection unit 20 may be connected to a single one of these outputs. Selection unit 20 may also be connected to data input data-IN or to inverse data input $\overline{\text{data}}$-IN, or to both inputs simultaneously.

A function of selection unit 20 is to control transistors $M_3$ and $M_5$. Unit 20 is provided to turn on transistor $M_3$ and to turn off transistor $M_5$ when node A must switch from level 0 to level 1 and, accordingly, when node B must switch from level 1 to level 0. Unit 20 is also provided to turn off transistor $M_3$ and turn on transistor $M_5$ when node A must switch from level 1 to level 0 (and node B must switch from 0 to 1).

The practical forming of selection unit 20 is within the abilities of those skilled in the art based on the function to be implemented. For instance, unit 20 will be connected to at least one of terminal data-IN, DATA-OUT, $\overline{\text{data}}$-IN or $\overline{\text{DATA}}$-OUT, or to another circuit location, having a voltage in relation with one of the above terminals. Selection unit 20 will comprise one or several logic gates associated with combinational logic. For example, unit 20 will comprise detectors of the level of signals DATA and $\overline{\text{DATA}}$, as well as delay elements so that the level translator circuit has time to fully settle between two state switchings. The signals provided by the detectors of the level of DATA and $\overline{\text{DATA}}$ may be logically combined to generate the output signals of selection unit 20 to turn transistors $M_3$ or $M_5$ on or off. The level detectors and the delay elements may be formed by means of inverters. A possible diagram of selection unit 20 will be described in relation with FIG. 7.

The operation of the circuit of FIG. 3 will now be described.

Assume that input data-IN is at level 0. Transistor $M_0$ is off. Transistor $M''_0$ is on. Transistor $M_2$ is on and node A is at level 1. Transistor $M_3$ is indifferently on or off, selection unit 20 only having to provide for transistor $M_3$ to be off at the time when the input data switch to level 1 in one embodiment. When input data-IN is at level 0, transistor $M_1$ is on. Transistor $M''_1$ is off and node B is at level 0. Transistor $M_5$ is indifferently on or off, selection unit 20 only having to provide for transistor $M_5$ to be turned on at the time when the input data switch to level 1 in one embodiment. Transistor $M_4$ is nearly off, but not totally since its gate is at a low voltage (VDD).

At the time when the input data switch from level 0 to level 1 (from voltage 0 to voltage VDD), transistor $M_0$ turns on. Since the voltage (VDD) between the gate and the source of transistor $M_0$ is low and close to the threshold of transistor $M_0$, the current running through transistor $M_0$ is low. Transistor $M''_0$ is still on. Transistor $M''_0$ is likely to provide a significant current since it operates with a high gate-source voltage, close to V+.

The gate-source voltage of transistor M2, which remains on, is decreased by voltage VDD, which decreases its saturation current. Given that transistor M2 has been designed to provide a low current, since the branch formed by transistor M2 is provided to exhibit a high impedance, the current running through transistor M2 is low. Transistor M3 is off since it has been turned off before the input data switch to level 1 by selection unit 20.

Since transistor $M_3$ is off, transistor $M_2$ limits the current provided by transistor $M''_0$. Thus, the current flowing from node N to node A is smaller than what it would have been without the presence of transistors $M_2$ and $M_3$ and the voltage of node A reaches level 0 faster than in the absence of transistor $M_2$. In an embodiment, transistor $M_2$ is sized so that the current that it conducts is as small as possible, while remaining greater than the leakage current of transistor $M_0$.

Regarding the circuit behavior at node B when the input data switch from level 0 to level 1, transistor $M_1$ turns off. Transistor $M''_1$ will rapidly turn on since the voltage at node A lowers rapidly. Transistor $M_5$ is on since it has been turned on by selection unit 20 before the data switch to level 1. Transistors M'', and $M_5$ being likely to provide a significant current, the voltage at node B will increase rapidly and reach level 1 rapidly. Transistor $M_4$ turns on, but this transistor has little influence since it has a low saturation current.

As a conclusion, the presence of transistor $M_2$, that is, of a high-impedance branch between nodes A and C, has enabled the level of node A to decrease rapidly and the presence of transistor $M_5$, that is, of a low-impedance branch between nodes B and D, has enabled node B to increase rapidly. Thus, the circuit of FIG. 3 enables a fast transition when the data switch from level 0 to level 1.

The circuit behavior when the input data switch from level 1 to level 0 can be deduced from its behavior when the data switch from level 0 to level 1. Thus, on switching of the input data from level 1 to level 0, transistor $M_0$ turns off and transistor $M_1$ turns on. Transistor $M''_0$ remains off and transistor $M''_1$ remains on. Transistor $M_4$ is slightly conductive since its gate-source voltage is decreased by voltage VDD and transistor $M_5$ is off since it has been turned off before the switching to level 0 of the data by selection unit 20. The current running through branch NB is limited by the fact for transistor $M_5$ to be off and the voltage at node B rapidly decreases, which causes a fast turning-on of transistor $M''_0$. Since transistor $M_3$ has been turned on by selection unit 20 before the switching to 0 of the data, transistors $M''_0$ and $M_3$ provide a strong current which will enable node A to rapidly reach its high level (V+). Here again, the presence of the parallel high- and low-impedance paths has enabled a faster switching than in prior art.

In one embodiment, transistor $M_4$ is sized so that the current that it conducts is as low as possible, while remaining greater than the leakage current of transistor $M_1$.

As a conclusion, the presence of the high-impedance branches between nodes A and C on the one hand and between nodes B and D on the other hand, associated with low-impedance branches likely to be activated or deactivated has enabled to decrease switching times. It should be noted that the high-impedance branches, in addition to limiting the saturation current of transistors $M''_0$ and $M''_1$, may also be used to compensate for the leakage current of transistors $M_0$ and $M_1$ when these transistors are off.

As for the low-impedance branches, they enable the flowing of the saturation current of transistors $M''_0$ and $M''_1$ when they are activated.

Selection unit 20 may operate in various ways. What matters is for it to have adequately activated or deactivated the low-impedance branches between the end of a transition and the beginning of the next transition.

In one embodiment, selection unit 20 acts on the low-impedance branches just after each transition. In this case, when, for example, node A has just switched to level 0 and node B has just switched to level 1, selection unit 20 operates to turn on transistor $M_3$ and to turn off transistor $M_5$, which will be operational for the next transition. Delays may be provided to ensure for the levels of nodes A and B to have properly settled. It may also be provided, knowing the data frequency, for selection unit 20 to operate just before each transition.

It should be noted that transistors $M_3$ and $M''_0$ (respectively $M_5$ and $M''_1$) are not necessarily identical. Indeed, their gate-source voltage is not the same and transistors $M_3$ and $M''_0$ (respectively, $M_5$ and $M''_1$) may be designed to have the same saturation current. It should be noted that transistors $M_2$ and $M_4$ may have very low saturation currents, which may be of the same order of magnitude as the leakage currents of transistors $M_0$ and $M_1$. Regarding voltages, it is known that, according to the current tendency, voltages within integrated circuits keep on decreasing (for example, they may currently be 0.9 volt) while the external circuit is provided for greater voltages (for example, from 1.8 volts to 5 volts). The transistors of the circuit of FIG. 3 may be designed to withstand all the maximum voltages to which they may be submitted. A circuit according to one embodiment may be usable in a wide frequency range. For example, it is used for data frequencies ranging from less than 10 MHz to more than 500 MHz.

Those skilled in the art may modify the circuit of FIG. 3 without departing from the framework of the embodiment.

Figure 5:
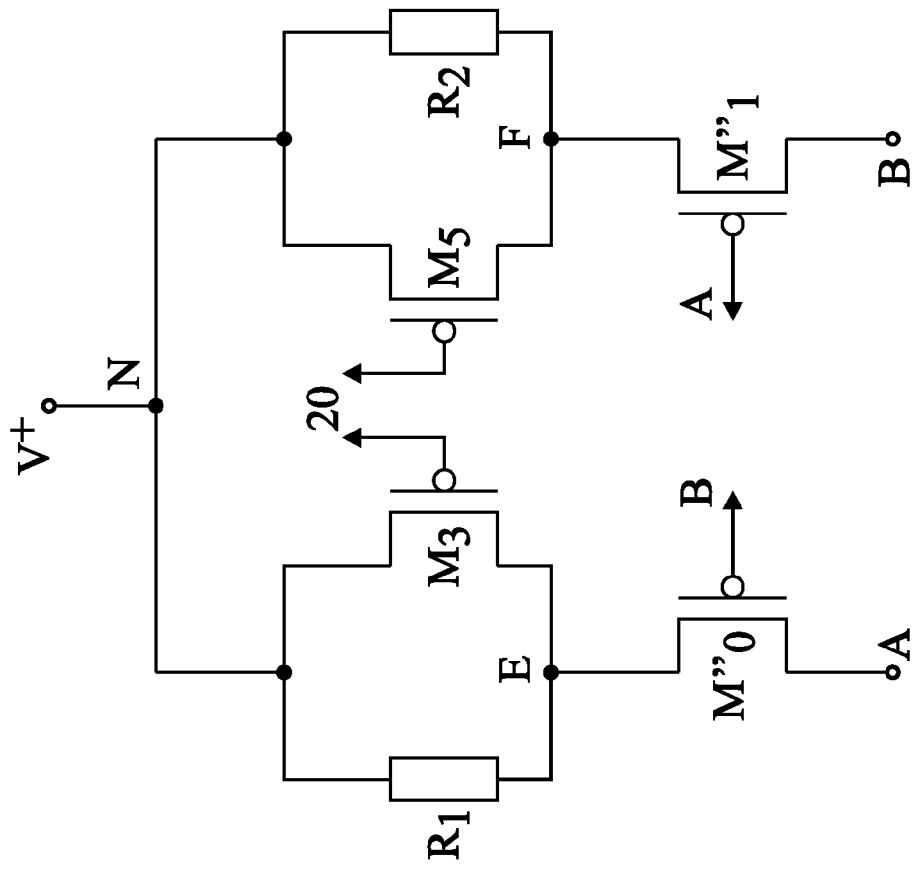
FIGS. 4 to 6 show other embodiments of a translator circuit.
Figure 4:
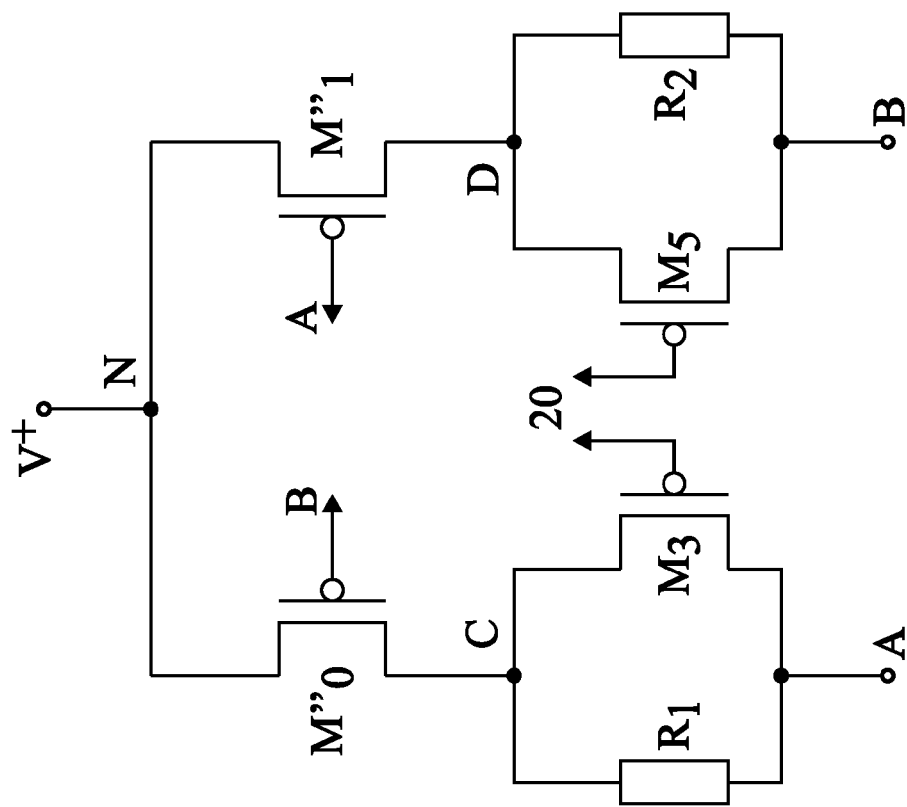
Figure 6:
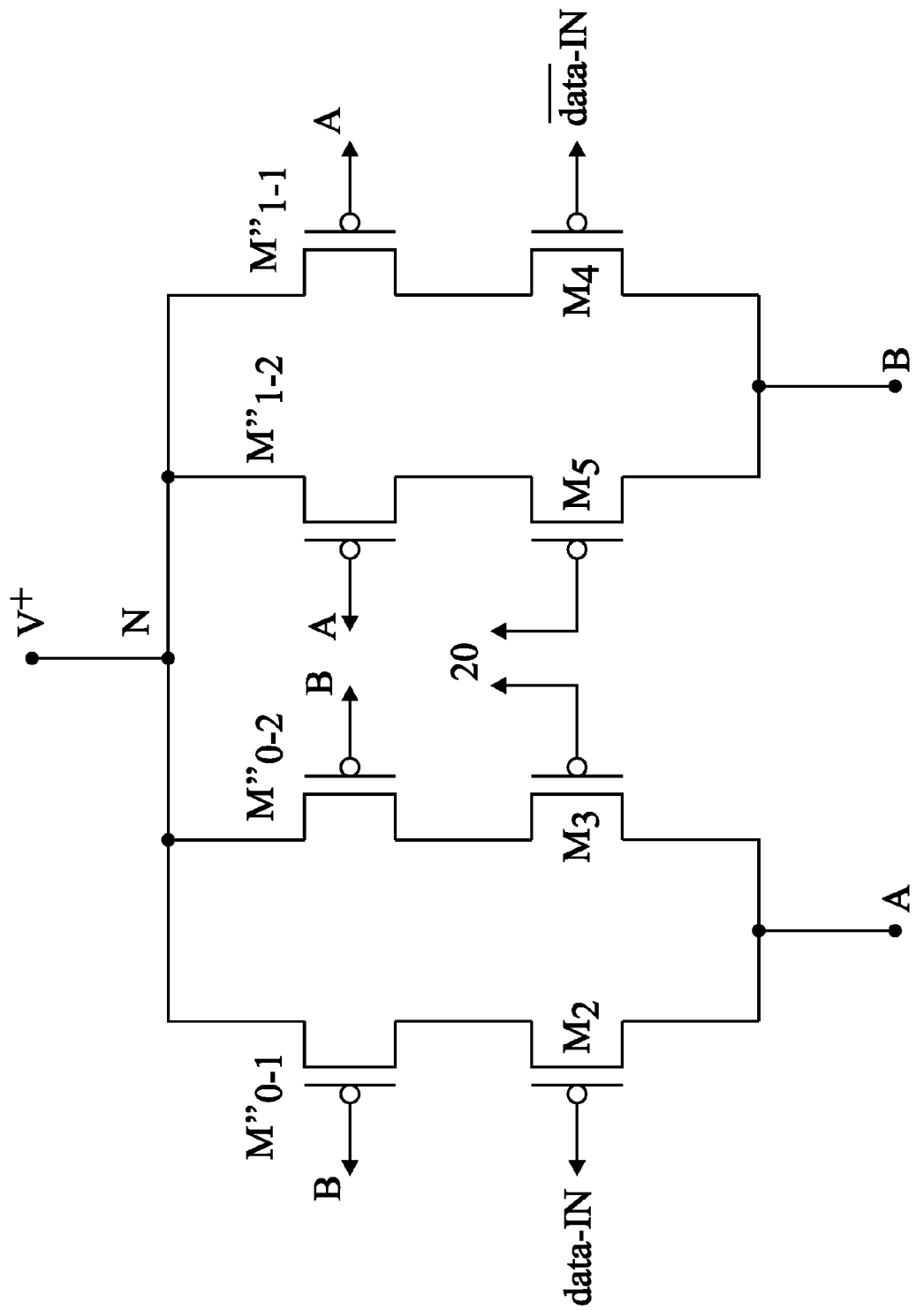

Thus, FIGS. 4 to 6 illustrate examples of modifications of FIG. 3 which comprise other embodiments.

FIG. 4 shows the portion of circuit 10 of FIG. 3 located between nodes N and A on the one hand, and N and B on the other hand. In FIG. 4, a resistor R1 located between nodes C and A replaces transistor $M_2$ of FIG. 3. Resistor R1 plays the same role as transistor $M_2$ of FIG. 3 (holding of node A to 1 (V+) by compensating for the leakage current of $M_0$; fast switching of node A to zero). Since resistor R1 belongs to the high-impedance path, its ohmic value will preferably be high. Similarly, in FIG. 4, a resistor R2, preferably of high value, is located between nodes D and B. Resistor R2 replaces transistor $M_4$ of FIG. 3 and plays the same role. In FIG. 4, transistors $M_3$ and $M_5$ are of course controlled in the same way as in FIG. 3.

FIG. 5 shows an embodiment in which the two parallel paths at high and low impedance are located between node N and a node E. Transistor $M''_0$ is located between node E and node A. Similarly, two branches, one at low impedance and the other one at high impedance, are located between node N and a node F. Transistor $M''_1$ is located between node F and node B. Of course, in FIG. 5, resistors R1 and R2 may be replaced with transistor $M_2$ and $M_4$ of FIG. 3. The operation of the circuit of FIG. 5 is similar to that of FIG. 3 and will not be described any further.

In FIG. 6, the high and low impedance paths connect nodes N and A on the one hand, and node N and B on the other hand. Transistor M"$_0$ is duplicated in a transistor M"$_{0-1}$, in series with transistor M$_2$, and a transistor M"$_{0-2}$, in series with transistor M$_3$. Transistors M"$_{0-1}$ and M"$_{0-2}$ both have their gate connected to node B. Symmetrically, node N is connected to node B by two paths in parallel, one containing a transistor M"$_{1-2}$ in series with transistor M$_5$ and one comprising a transistor M"$_{1-1}$ in series with transistor M$_4$.

Transistors M"$_{0-1}$ and M"$_{0-2}$ need not be identical. Transistor M"$_{0-1}$ in series with transistor M$_2$ may be a resistive transistor (small value of ratio W/L) while transistor M"$_{0-2}$ in series with transistor M$_3$ may have a low resistivity.

Figure 7:
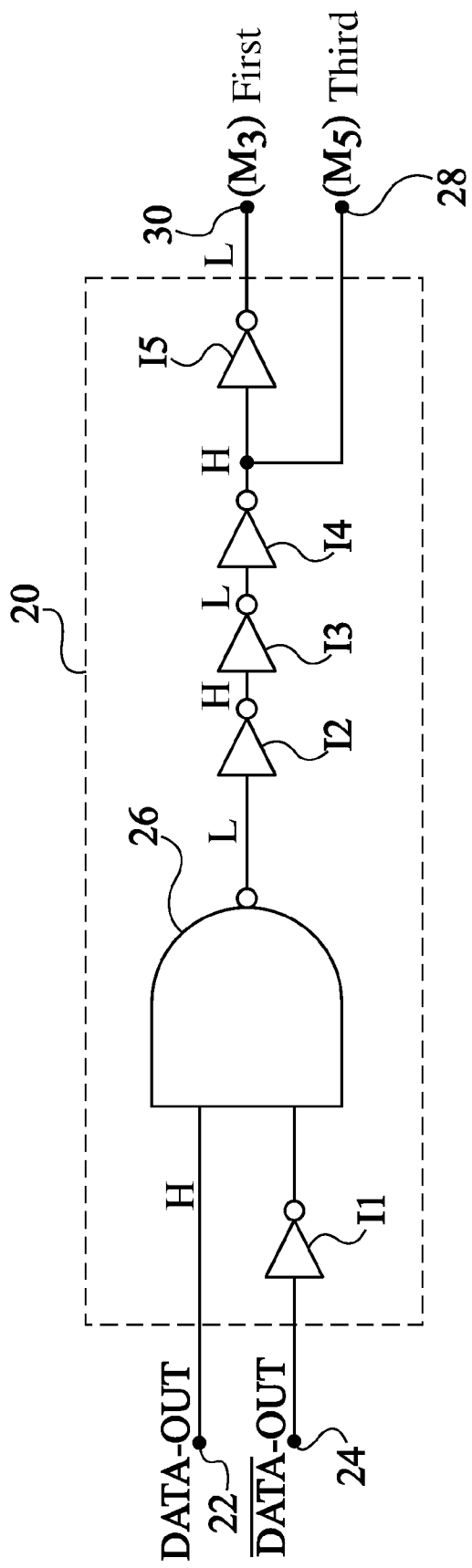
FIG. 7 schematically shows a selection unit.

Different variations and modifications will occur to those skilled in the art. In particular, according to the implementation of one embodiment, one or several of the transistors of the described circuits may be duplicated. Also, it is possible not to ground the low voltage level, node M then being connected to a voltage V− different from zero. As has already been indicated, selection unit 20 may be formed in various ways. FIG. 7 provides an embodiment of unit 20, which will be briefly described hereafter.

In FIG. 7, selection unit 20 has an input 22 connected to terminal $\overline{\text{DATA-OUT}}$ of FIG. 3, and an input 24 connected to terminal $\overline{\text{DATA}}$-OUT. Input 22 is connected to an input of a two-input NAND gate 26. Input 24 is connected to the second input of gate 26 via an inverter I1. The output of gate 26 drives three inverters in series I2, I3, and I4. The output of inverter I4 is connected to a terminal 28, which controls the gate of transistor M$_5$. The output of inverter 14 is also connected to the input of an inverter 15, having its output connected to a terminal 30 which controls the gate of transistor M$_3$. In the circuit of FIG. 7, the propagation delay in NAND gate 26 and inverters I2, I3, and I4 should be greater than the switching time of the level translator circuit.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage-level translator circuit comprising:
a first MOS transistor of a first type, having a gate configured to receive input data varying between a first voltage level and a second voltage level smaller than the first voltage level, the first MOS transistor having a source coupled to a first node and a drain coupled to a second node;
a second MOS transistor of the first type, having a gate configured to receive an inverse of the input data, a source coupled to the first node, and a drain coupled to a third node;
a third MOS transistor of a second type, having a gate coupled to the third node, a source coupled to a fourth node, and a drain coupled to the second node;
a fourth MOS transistor of the second type, having a gate coupled to the second node, a source coupled to the fourth node, and a drain coupled to the third node the third node being configured to issue output data corresponding to the input data and the second node being configured to issue an inverse of the output data, the output data varying between a third voltage level and the second voltage level, the third voltage level being greater than the first voltage level;
first and second branches between the second node and the fourth node, the second branch having a smaller impedance than the first branch;
third and fourth branches between the third node and the fourth node, the fourth branch having a smaller impedance than the third branch; and
a selection unit configured to activate the second branch and deactivate the fourth branch before the second node switches from the second voltage level to the third voltage level and configured to deactivate the second branch and activate the fourth branch before the second node switches from the third voltage level to the second voltage level.

2. The circuit of claim 1, wherein the first type corresponds to NMOS transistors and the second type corresponds to PMOS transistors, and wherein the first node is coupled to ground and the fourth node is coupled to a positive supply voltage.

3. The circuit of claim 1, wherein the selection unit is coupled to at least one of the second and third nodes.

4. The circuit of claim 1, wherein the second or the fourth branch comprises a first PMOS transistor.

5. The circuit of claim 4, wherein the first or the third branch comprises a second PMOS transistor with a lower saturation current than the PMOS transistor of the second or fourth branch.

6. The circuit of claim 1, wherein the first or the third branch comprises a resistor.

7. The circuit of claim 1, wherein:
the first and second branches are connected in parallel between the second and the fourth nodes, the first branch comprising the third MOS transistor series-connected with a first high-impedance element and the second branch comprising a fifth MOS transistor series-connected with a first low-impedance element;
the third and fourth branches are connected in parallel between the third and the fourth nodes, the third branch comprising the fourth MOS transistor series-connected with a second high-impedance element and the fourth branch comprising a sixth MOS transistor series-connected with a second low-impedance element; and
the third, fourth, fifth, and sixth MOS transistors are PMOS transistors.

8. The circuit of claim 1, wherein the selection circuit comprises one or several logic gates and inverters.

9. A voltage translator circuit comprising:
an input configured to receive an input signal of either a first voltage level or a second voltage level higher than the first voltage level;
an inverted input configured to receive an inverse of the input signal;
an output configured to supply an output signal corresponding to the input signal, the output signal being either the first voltage level or a third voltage level, the third voltage level being higher than the second voltage level;
an inverted output configured to supply an inverse of the output signal;
a first conduction path and a second conduction path between a high voltage supply node and the output, the first conduction path having a lower impedance than the second conduction path;
a third conduction path and a fourth conduction path between the high voltage supply node and the inverted output, the third conduction path having a lower impedance than the fourth conduction path; and a selection circuit configured to both activate the first conduction path and to deactivate the third conduction path prior to the input switching from the second voltage level to the first voltage level, and to both deactivate the first conduction path and activate the third conduction path prior to the input switching from the first voltage level to the second voltage level.

10. The circuit of claim 9 wherein selection circuit has first and second inputs coupled to the output and the inverted output, respectively.

11. The circuit of claim 10 wherein the selection circuit is configured to activate the first conduction path and deactivate the third conduction path in response to detecting that the output has changed from the first voltage level to the third voltage level.

12. The circuit of claim 11 wherein the selection circuit is configured to deactivate the first conduction path and activate the third conduction path in response to detecting that the output has changed from the third voltage level to the first voltage level.

13. The circuit of claim 9 wherein the selection circuit includes:
a logic circuit having an input and an output, the input being coupled to the output of the voltage translator circuit, the logic circuit being configured to detect a change in voltage level at the output of the voltage translator circuit; and
a delay circuit having an input coupled to the output of the logic circuit and first and second outputs coupled to control terminals of the first and third conduction paths, the delay circuit being configured to control the first and third conductions paths after a delay that is longer than a switching time of the level translator circuit.

14. The circuit of claim 9 wherein the first conduction path comprises a first low impedance PMOS transistor having a gate coupled to the selection circuit and the third conduction path comprises a second low impedance PMOS transistor having a gate coupled to the selection circuit.

15. The circuit of claim 14 wherein the second and fourth conduction paths respectively comprise first and second high impedance PMOS transistors.

16. The circuit of claim 14 wherein the second and fourth conduction paths comprise first and second high impedance resistors.

17. The circuit of claim 14, further comprising:
a first control PMOS transistor having a gate coupled to the output, a source coupled to the voltage supply node, and a drain coupled to the inverted output by the first and second conduction paths coupled in parallel; and
a second control PMOS transistor having a gate coupled to the inverted output, a source coupled to the voltage supply node, and a drain coupled to the output by the third and fourth conduction paths coupled in parallel.

18. The circuit of claim 14, further comprising:
a first control PMOS transistor having a gate coupled to the output, a drain coupled to the inverted output, and a source coupled to the voltage supply node by the first and second conduction paths coupled in parallel; and
a second control PMOS transistor having a gate coupled to the inverted output, a drain coupled to the output; and a source coupled to the voltage supply node by the third and fourth conduction paths coupled in parallel.

19. The circuit of claim 14, further comprising:
a first control PMOS transistor having a gate coupled to the output, a source coupled to the voltage supply node, and a drain coupled to the inverted output by the first conduction path;
a second control PMOS transistor having a gate coupled to the output, a source coupled to the voltage supply node, and a drain coupled to the inverted output by the second conduction path;
a third control PMOS transistor having a gate coupled to the inverted output, a source coupled to the voltage supply node, and a drain coupled to the output by the third conduction path; and
a fourth control PMOS transistor having a gate coupled to the inverted output, a source coupled to the voltage supply node, and a drain coupled to the output by the fourth conduction path.

20. A voltage translation, comprising:
receiving an input signal of either a first voltage level or a second voltage level higher than the first voltage level:
receiving an inverse of the input signal;
supplying at a first output node an output signal corresponding to the input signal, the output signal being either the first voltage level or a third voltage level, the third voltage level being higher than the second voltage level:
supplying at a second output node an inverse of the output signal;
activating a first conduction path and deactivating a second conduction path prior to the input signal switching from the second voltage level to the first voltage level, the first conduction path being between a voltage supply node and the first output node, and the second conduction path being between the voltage supply node and the second output node:
deactivating the first conduction path and activating the second conduction path prior to the input signal switching from the first voltage level to the second voltage level;
detecting a change in voltage level at the first output node; and
delaying the activating and deactivating steps until after a delay that is longer than a switching time in which the first output node changes a voltage level in response to a change in voltage level of the input signal.

21. The method of claim 20 wherein deactivating the first conduction path and activating the second conduction path includes deactivating the first conduction path and activating the second conduction path in response to detecting that the voltage level of the first output node has changed from the third voltage level to the first voltage level.

* * * * *

UNITED STATES PATENT AND TRADEMARK OFFICE
CERTIFICATE OF CORRECTION

| | | |
|---|---|---|
| PATENT NO. | : 7,888,967 B2 | |
| APPLICATION NO. | : 12/543395 | |
| DATED | : February 15, 2011 | |
| INVENTOR(S) | : Sylvain Majcherczak | |

It is certified that error appears in the above-identified patent and that said Letters Patent is hereby corrected as shown below:

Column 10
Claim 20, Line 24, "A voltage translation, comprising:" should read as --A voltage translation method, comprising:--.

Signed and Sealed this
Fifth Day of April, 2011

David J. Kappos
*Director of the United States Patent and Trademark Office*